US009306555B2

(12) United States Patent
Muljono et al.

(10) Patent No.: US 9,306,555 B2
(45) Date of Patent: Apr. 5, 2016

(54) APPARATUS AND METHOD TO ACHIEVE CPAD MITIGATION EFFECTS

(71) Applicant: Intel Corporation, Santa Clara, CA (US)

(72) Inventors: Harry Muljono, San Ramon, CA (US); Kai Xiao, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 14/136,356

(22) Filed: Dec. 20, 2013

(65) Prior Publication Data

US 2015/0180459 A1 Jun. 25, 2015

(51) Int. Cl.
*H03K 3/00* (2006.01)
*H03B 1/00* (2006.01)
*H03K 17/0412* (2006.01)
*H03K 17/16* (2006.01)
*H03K 17/687* (2006.01)
*H03K 19/0185* (2006.01)

(52) U.S. Cl.
CPC ........ *H03K 17/04123* (2013.01); *H03K 17/162* (2013.01); *H03K 17/6871* (2013.01); *H03K 19/0185* (2013.01)

(58) Field of Classification Search
USPC ............. 327/108, 111; 326/82–83, 88–89, 92
See application file for complete search history.

(56) References Cited

U.S. PATENT DOCUMENTS

| 4,549,214 | A | * | 10/1985 | Hinn | .............................. | 348/696 |
| 5,153,530 | A | * | 10/1992 | Takagi et al. | ................... | 331/17 |
| 5,237,214 | A | * | 8/1993 | Usami | ........................... | 326/110 |
| 7,358,771 | B1 | | 4/2008 | Talbot | | |
| 8,917,076 | B2 | * | 12/2014 | Hsing et al. | ................... | 323/284 |
| 2007/0001704 | A1 | | 1/2007 | O'Mahony | | |
| 2013/0002301 | A1 | | 1/2013 | Gondi et al. | | |
| 2013/0154677 | A1 | | 6/2013 | Sun et al. | | |

FOREIGN PATENT DOCUMENTS

EP 1897304 B1 7/2011

OTHER PUBLICATIONS

PCT International Search Report and Written Opinion for PCT Application No. PCT/US2014/066431, dated 2015-28-15, 13 pages.

* cited by examiner

*Primary Examiner* — An Luu
(74) *Attorney, Agent, or Firm* — Schwabe, Williamson & Wyatt, P.C.

(57) ABSTRACT

An apparatus is configured to achieve Cpad mitigation effects. The apparatus may include a switch coupled to a current source with first and second states. The apparatus may also include a pad coupled to the switch and having a pad capacitance that charges and discharges based on changes between the first and second switch states. The apparatus may further include a resistor coupled to the switch and the pad, and the resistor is configured to be modulated to reduce the charging or discharging time of the pad.

17 Claims, 4 Drawing Sheets

APPARATUS AND METHOD TO ACHIEVE CPAD MITIGATION EFFECTS

TECHNICAL FIELD

This disclosure relates generally to electronic circuits. More particularly but not exclusively, the present disclosure relates to circuits and methods to achieve pad capacitance (Cpad) mitigation effects.

BACKGROUND INFORMATION

Input/output (I/O) plays a crucial role in computer and telecommunication. High-speed serial communication may offer greater advantages than parallel communication. In terms of distance, the cost of cable and synchronization requirements makes serial communication a practical choice. In terms of speed, parallel communication may no longer provide a reliable, cost effective means to keep signals synchronized once data rate exceeds about 1 Gb/s.

However, serial I/O based designs have their own performance limitations as signal processing became more sophisticated. Pad capacitance may be a key limitation for high-speed serial I/O performance. Cpad may reduce rise/fall edge rate at the receiving end introduce insertion loss and termination mismatch, and produce Inter-Symbol Interference (ISI) jitter.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Embodiments of apparatus and method for Rterm modulation to achieve Cpad mitigation effect are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One embodiment provides an apparatus and related methods to modulate Rterm of a current mode driver to mitigate the impact of Cpad, thus achieving Cpad mitigation effects. The embodiment of the apparatus may increase the Rterm value to enable a coupled pad to be charged up quickly when its Cpad is making a low-to-high transition. Likewise, the Rterm value may be decreased to enable Cpad to be discharged quickly when the pad is making a high-to-low transition. Accordingly, Cpad mitigation effects, such as sharp transition edges, faster transition time of the signal leaving the driver, increased eye margin of the signal transmitted from the driver, etc. may be achieved. These Cpad mitigation effects may improve high-speed serial I/O performance.

Figure 1:
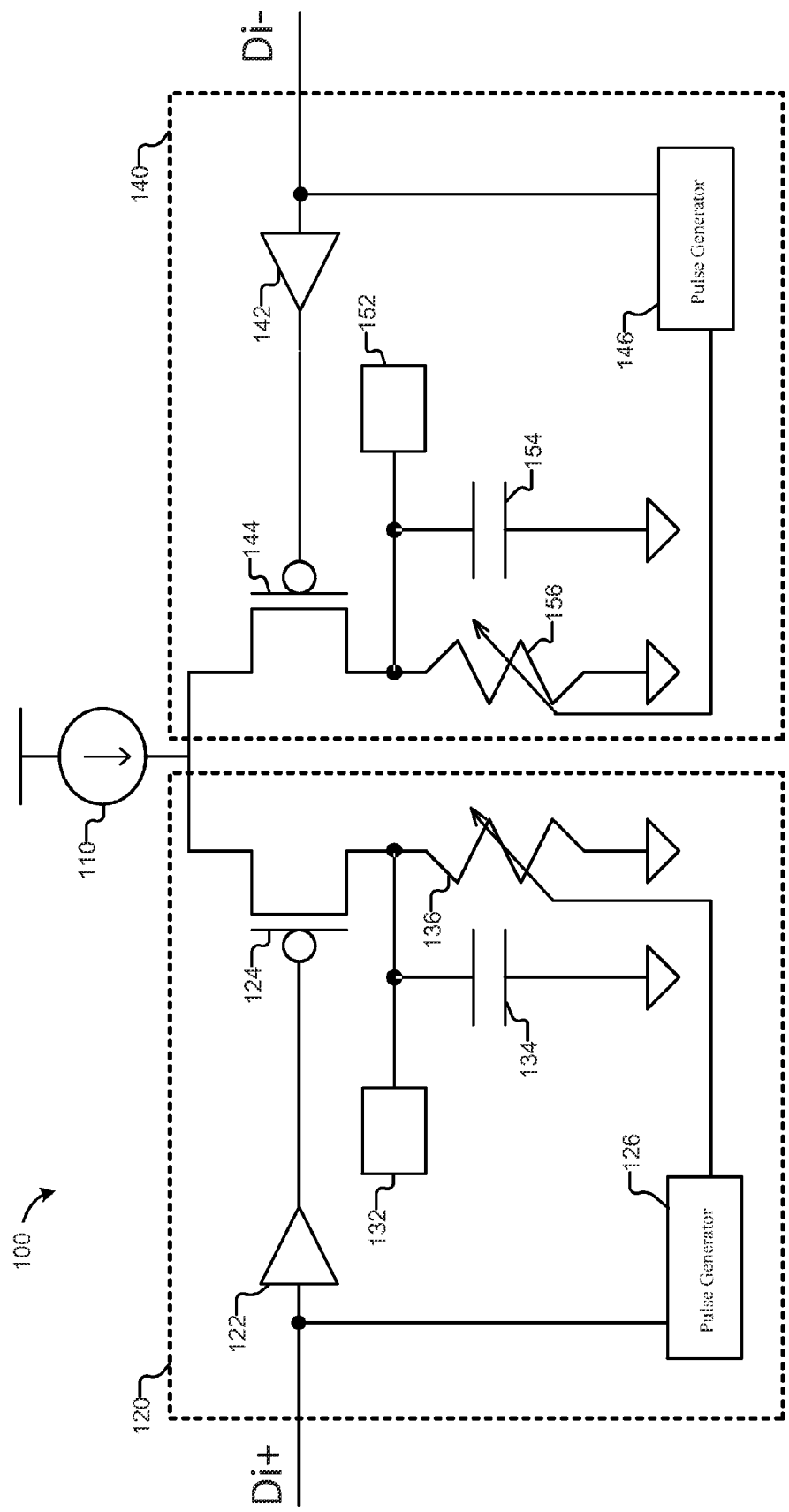
FIG. 1 is a diagram of a termination resistance (Rterm) modulation system, in accordance with one embodiment.

Referring now to FIG. 1, shown generally is an Rterm modulation system 100 of one embodiment. In embodiments, system 100 may have power source 110 coupled with subsystems 120 and 140. Subsystem 120 may include buffer 122, switch 124, pulse generator 126, output 132, pad 134, and resistor 136. Subsystem 140 may similarly include buffer 142, switch 144, pulse generator 146, output 152, pad 154, and resistor 156.

In embodiments, power source 110 may be a current source that may supply constant current to subsystems 120 and 140. Power source 110 may be coupled to a terminal of switch 124. Another terminal of switch 124 may be coupled to buffer 122. Yet another terminal of switch 124 may be coupled to output 132, pad 134, and resistor 136. Buffer 122 may couple to pulse generator 126, and both may receive a control signal Di+. Pulse generator 126 may also couple to resistor 136.

Similarly, power source 110 may be coupled to a terminal of switch 144. Another terminal of switch 144 may be coupled to buffer 142. Yet another terminal of switch 144 may be coupled to output 152, pad 154, and resistor 156. Buffer 142 may couple to pulse generator 146, and both may receive a control signal Di−. Pulse generator 146 may also couple to resistor 156.

In embodiments, switch 124 or 144 may be implemented in P-type metal-oxide-semiconductor (PMOS) logic using p-channel metal-oxide-semiconductor field effect transistors (MOSFETs). In embodiments, switch 124 or 144 may be implemented in N-type metal-oxide-semiconductor (NMOS) logic using n-type MOSFETs. Switch 124 or 144 may have at least two states, namely one on state and one off state, thus may function as switches to be turned on or off. When switch 124 or 144 is to be turned on, the current from power source 110 may flow to output 132 or 152 respectively. Output 132 or 152 may be output drivers to output electric signals, e.g., into a communication channel (not shown).

In embodiments, the state of switch 124 or 144 may be controlled by the control signal Di+ or Di− respectively. In some embodiments, the control signal Di+ and Di− may be configured to be differential signals, opposing with each other. As an example, when Di+ is high, and Di− is low; switch 124 will go to an off state, and switch 144 will go to an on state. Resultantly, the current from power source 110 may flow to output 152 via switch 144. By the same token, when Di+ turns from high to low, and Di− turns from low to high; switch 124 will go to an on state, and switch 144 will go to an off state. Resultantly, the current from power source 110 may flow to output 132 via switch 124. Thus, depending on the control signals Di+ and Di−, the current from power source 110 may flow into subsystems 120 and 140 alternatively. When the control signals Di+ and Di− are differential, output 132 and 152 may also become differential. Thus, system 100 may show symmetrical behavior, and can be used for differential signaling in a serial link.

The eye margin (or eye opening), corresponding to the actual valid data time for the receiver in a communication channel, at the output 132 and 152 may be limited by the charging/discharging rate of pad 134. In embodiments, pad 134 may have pad capacitance. When the current flows through subsystem 120 or 140, it needs to be sunk into their respective resistor 136 or 156 and also charge pad 134 or 154, in order to bring output 132 or 152 up to a desirable voltage level. Thus, there will be a lag between switch 124 or 144 changing its state and sufficient voltage being seen at output 132 or 152 due to the pad capacitance of pads 134 and 154. The eye margin of output 132 and 152 may therefore be reduced due to Cpad.

Improved eye margin is desirable for high-speed serial communication as eye margin corresponds to the actual valid data time for the receiver in a communication channel. In embodiments, resistance of resistor 136 or 156 may be modulated to mitigate Cpad effect to increase the eye margin of output 132 or 152. As an example, when the voltage of output 132 or 152 is going from low to high, the resistance of resistor 136 or 156 may be increased to limit the current distributed to resistors and enable more current flow into pad 134 or 154 to charge them faster. On the contrary, when the voltage of output 132 or 152 is going from high to low, the resistance of resistor 136 or 156 may be reduced to enable pad 134 or 154 to discharge faster. As a result, the eye margin of output 132 or 152 may be increased.

In embodiments, system 100 may be a current mode driver and used for high-speed serial communication. The higher the pad capacitance of pad 134 or 154, the more signal loss may be expected. Resistors 136 and 156 may be termination resistors configured to terminate the line or absorb the signal reflection bounced back from the channel, e.g., caused by impedance mismatch. Enhanced by the teachings in this disclosure, a current mode driver may modulate its terminal resistors to enable faster charging or discharging of pad 134 or 154. This may mitigate the Cpad effect and, therefore, increase the eye margin on output 132 or 152 for high-speed communication.

In embodiments, Rterm of a current mode driver may be modulated during a transition edge of pad 134 or 154, such as when data goes out of the transmitter into the channels, or when pad 134 or 154 is being charged or discharged. Enhanced with the teachings in this disclosure, and as compared to systems with static resistors, the edge of a signal transition propagating down the channel may be sharper, and the channel insertion loss may be improved as the Cpad of pad 134 or 154 is reduced.

In embodiments, pulse generator 126 or 146 may be configured to control a timing and a duration of the modulation of resistor 136 or 156 after receiving control signal Di+ and Di− respectively. For examples, pulse generator 126 or 146 may be configured to control the pulse frequency, pulse width, delay, pulse voltage levels, and the rise time and fall time of the pulses. In one embodiment, pulse generator 126 or 146 may be configured to set a delay to the start of the modulation of the resistance of resistor 136 or 156 after switch 124 or 144 changes its state, e.g., from off to on. In another embodiment, pulse generator 126 or 146 may be configured to set a duration of the resistor modulation, e.g., the duration of the modulation may be set to be substantially equal to a unit interval (UI) of the data, corresponding to the actual data time, to achieve high performance. In other instances, the duration of the modulation may be set to be a fraction of the UI for energy saving, however, this setting may also be associated with relatively decreased performance. Thus, the duration of the modulation may be determined based on the tradeoff between energy saving and performance.

In embodiments, resistor 136 or 156 may be the termination resistor to minimize signal reflections. Resistor 136 or 156 may have multiple instances in parallel and connected in series with programmable switches to be programmed to match the line impedance of channel. In embodiments, these programmable switches may be controlled by pulse generator 126 or 146 to enable dynamic resistance modulation. As an example, switches may be selectively turned on or off based on the output from pulse generators 126 and/or 146. Thus, the resistance of resistor 136 or 156 may be modulated. In embodiments, additional new resistors may be added to resistor 136 or 156 to generate lower resistance if required.

In embodiments, system 100 may include additional resistors (not shown), configured to be in parallel connection with switch 124 and/or 144. As an example, such resistor may have one terminal coupled to power source 110 and the other terminal coupled to resistor 136, pad 134, and output 132. As another example, such resistor may have one terminal coupled to power source 110 and the other terminal coupled to resistor 156, pad 154, and output 152. In these embodiments, pulse generator 126 or 146 may be connected to these resistors parallel to switch 124 or 144, in addition to or instead of connecting to resistor 136 or 156. In these embodiments, such resistors parallel to switch 124 or 144 may be modulated by pulse generator 126 or 146 to reduce a charging or discharging time of the pad capacitance of pad 134 or 154. As an example, when switch 124 is on, the resistance of such resistor parallel to switch 124 may be pulled low to increase current to pad 134 to charge it faster. As another example, when switch 124 is off, the resistance of such resistor parallel to switch 124 may be pulled high to reduce current to pad 134 to permit it discharge faster.

Figure 2:
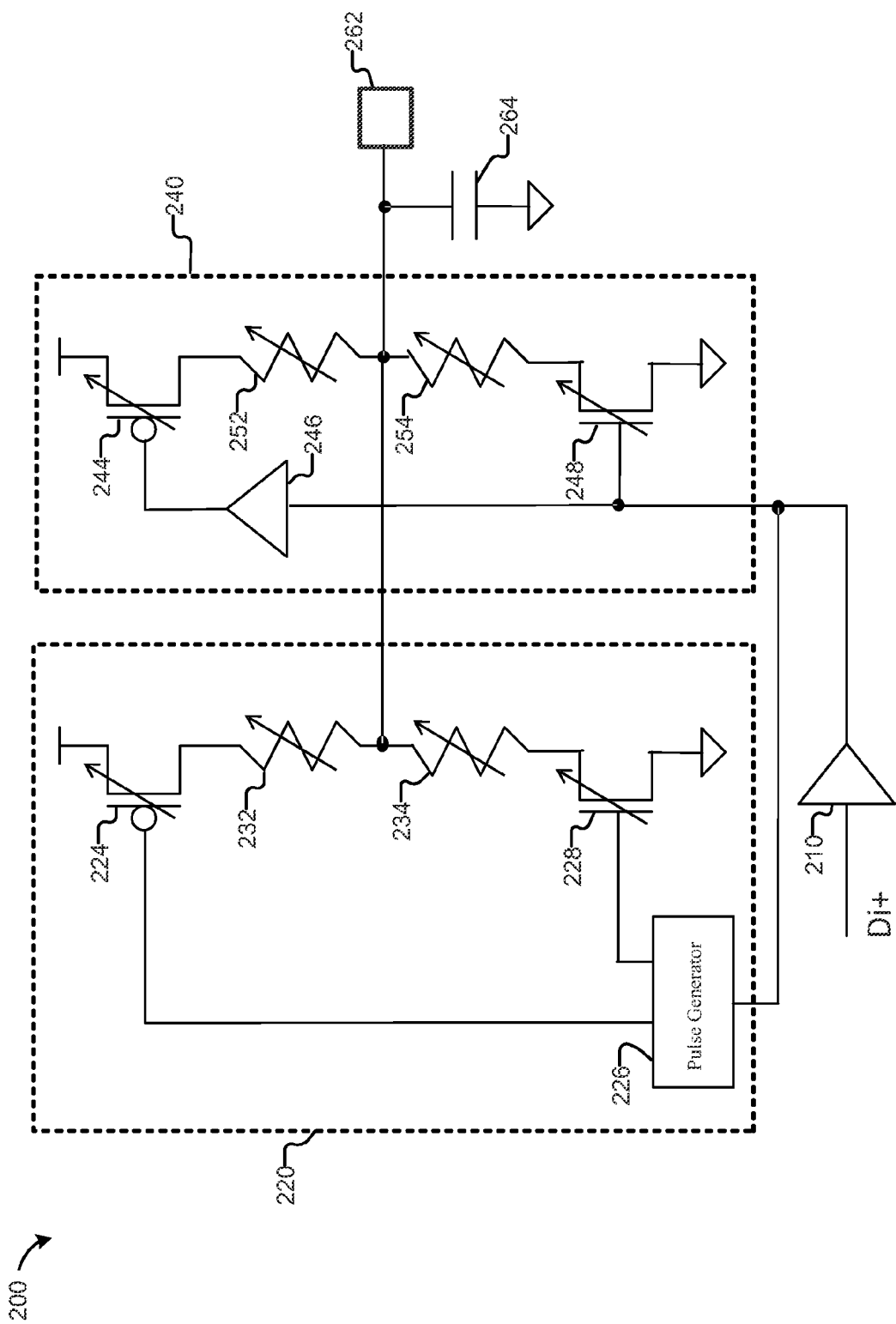
FIG. 2 is a diagram of a current modulation system, in accordance with one embodiment.

FIG. 2 is a diagram of a current modulation system 200, in accordance with one embodiment. In embodiments, system 200 may have buffer 210 coupled with subsystems 220 and 240. Subsystem 220 may include switch 224, pulse generator 226, switch 228, resistor 232, and resistor 234. Subsystem 240 may include switch 244, buffer 246, switch 248, resistor 252, and resistor 254. Moreover, system 200 may have pad 264 and output 262.

In subsystem 220, one terminal of switch 224 may be coupled to a power source (not shown), another terminal of switch 224 may be coupled to pulse generator 226, and yet another terminal of switch 224 may be coupled to resistor 232. One terminal of switch 228 may be coupled to the ground, another terminal of switch 228 may be coupled to pulse generator 226, and yet another terminal of switch 228 may be coupled to resistor 234. Buffer 210 may receive a control signal Di+. Pulse generator 226 may be coupled to buffer 210 to receive the control signal from buffer 210.

In subsystem 240, one terminal of switch 244 may be coupled to a power source (not shown), another terminal of switch 244 may be coupled to buffer 246, and yet another terminal of switch 244 may be coupled to resistor 252. One terminal of switch 248 may be coupled to the ground, another terminal of switch 248 may be coupled to buffer 210 to receive a control signal from buffer 210, and yet another terminal of switch 248 may be coupled to resistor 254. Buffer 246 may be coupled to buffer 210 to receive a control signal from buffer 210.

In embodiments, subsystem 240 may function as a voltage mode driver, which may enable output 262 to maintain a constant output voltage as current is drawn from 0 to full rated current to output 262. Subsystem 240 may have two states, such as the first state is a charging state to enable pad 264 to make a rising transition, and the second state is a discharging state to enable pad 264 to make a falling transition.

In embodiments, subsystem 220 may function as a kicker circuit, which may modulate the current transmitted to pad 264. In operation, when pad 264 makes a rising transition after switching on switch 244, switch 224 may be enabled momentarily to provide more current needed to charge up the Cpad of pad 264. Likewise, when pad 264 makes a falling transition after switching on switch 248, switch 228 may be momentarily turned on to help discharge the Cpad of pad 264. In embodiments, pulse generator 226, similar to pulse generator 126 in connection with FIG. 1, may be configured to control a timing and a duration of the modulation of resistor 232 or 234 after receiving control signal from buffer 210. As the result, pad transition may become faster. Cpad mitigation effects, such as wider eye margin available at the receiver, may be achieved. These Cpad mitigation effects may improve high-speed serial I/O performance.

Figure 3:
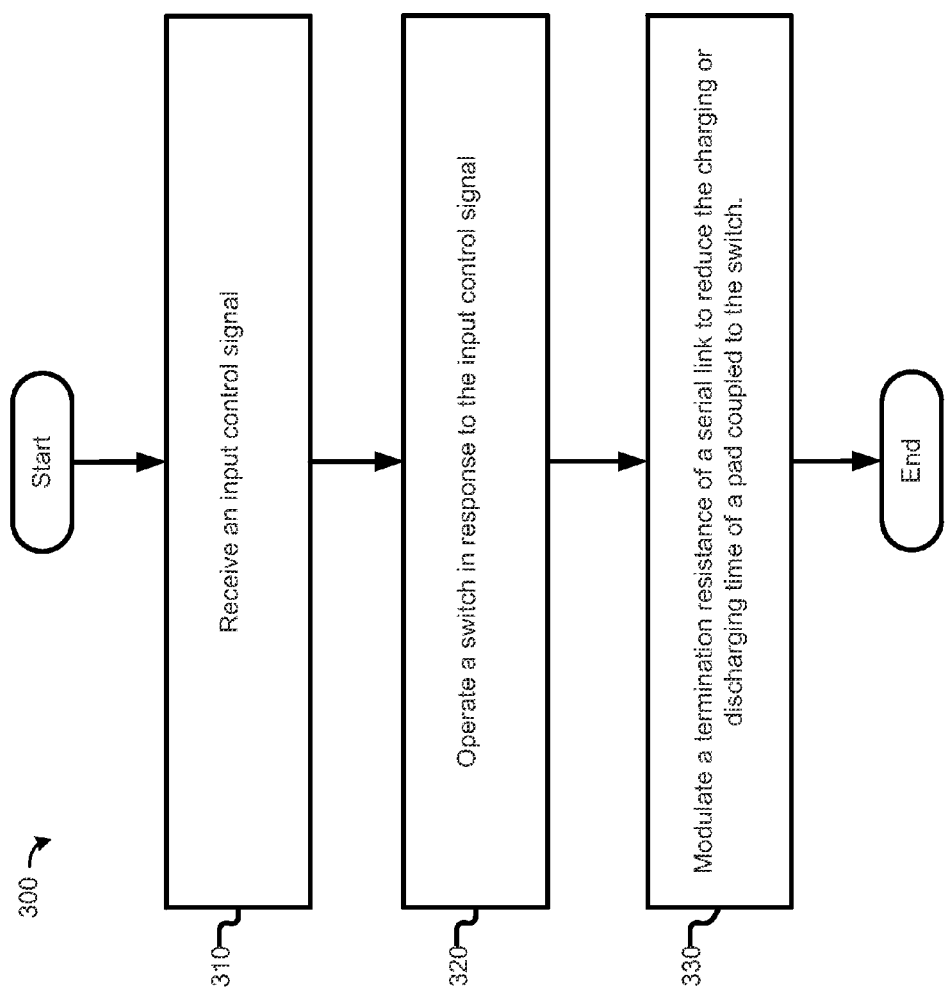
FIG. 3 is a flow diagram of an example process for Rterm modulation, in accordance with various embodiments.

FIG. 3 is a flow diagram of an example process 300 for Rterm modulation, which may be practiced by an example apparatus in accordance with various embodiments. Process 300 may be performed by system 100 to implement one or more embodiments of the present disclosure. In embodiments, process 300 may be performed in reference to subsystem 120 and/or 140.

In embodiments, the process may begin at block 310, where an input control signal may be received, e.g., by subsystem 120 or 140. In embodiments, control signals may be differential to subsystem 120 and 140 to generate the same ramp rate of the signal going low to high and high to low, thus enabling differential signaling, e.g., for a serial link.

Next, at block 320, a switch may be operated in response to the input control signal. In embodiments, the switch may be implemented as a PMOS or NMOS switch, and the switch may change from one state to another based on the received control signal. When the switch changes to an on state, the current may flow from a current source to subsystem 120 or 140. The current may need to charge a pad in the subsystem first before being able to bring the output voltage of the subsystem 120 or 140 to a desirable level.

Next, at block 330, a termination resistance of a serial link may be modulated to reduce a charging or discharging time of a pad coupled to the switch. In embodiments, termination resistors may be configured in system 100 to terminate the line or absorb the signal reflection bounced back from the channel of a serial link connected to system 100. The resistance of the termination resistors may be modulated to enable faster charging or discharging of pads in system 100, thus mitigating a Cpad effect and increasing the eye margin of signals transmitted on the serial link. In embodiments, Rterm may be modulated while data goes out of the transmitter into the channel, or while the pads are being charged or discharged. In embodiments, the timing and the duration of such modulation may also be configured.

Embodiments of the Rterm modulation described herein may be used in a number of implementations and applications including high-speed serial link interface. For example, mobile devices, including but not limited to smartphones, tablets and other Mobile Internet Devices (MIDs) that may have circuit(s) that would benefit from mitigated Cpad effect. Resultantly, high-speed serial I/O performance may be improved for such devices.

Figure 4:
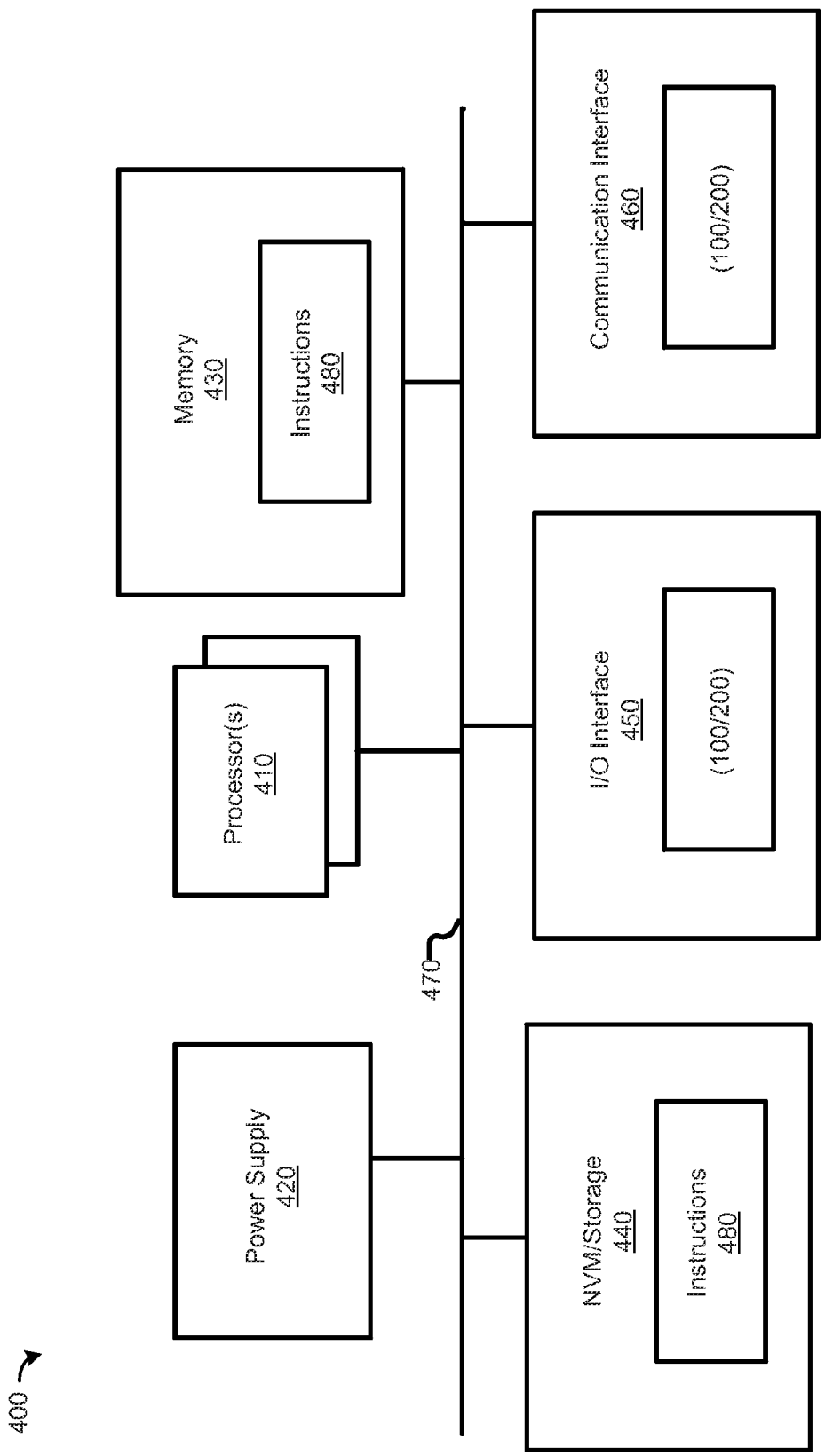
FIG. 4 is a block diagram that illustrates an example computer system suitable to practice the disclosed circuitry and methods to achieve Cpad mitigation effects, in accordance with various embodiments.

FIG. 4 is a block diagram that illustrates an example computer system 400 suitable to practice the disclosed apparatus or method of various embodiments. As shown, the computer system 400 may include a power supply unit 420, a number of processors or processor cores 410, a system memory 430 having processor-readable and processor-executable instructions 480 stored therein, a non-volatile memory (NVM)/storage 440 that may also store the instructions 480, an I/O interface 450, and a communication interface 460. For the purpose of this application, including the claims, the terms "processor" and "processor cores" may be considered synonymous, unless the context clearly requires otherwise.

The NVM/storage 440 and/or the memory 430 may comprise a tangible, non-transitory computer-readable storage device (such as a diskette, hard drive, compact disc read only memory (CDROM), hardware storage unit, flash memory, phase change memory (PCM), solid-state drive (SSD) memory, and so forth). The instructions 480 stored in the NVM/storage 440 and/or the memory 430 may be executable by one or more of the processors 410.

The computer system 400 may also comprise input/output devices (not shown) coupled to the computer system 400 via I/O interface 450. In various embodiments and purely by way of example, the I/O interface 450 may include system 100 or 200 and/or configured to perform method 300 that modulates Rterm to generate Cpad mitigation effect, thus improves high-speed serial links performance for I/O devices, e.g., PCI Express (Peripheral Component Interconnect Express), Serial ATA (Advanced Technology Attachment) (SATA). System 100 or 200 (or other components of the system 400) may alternatively or additionally be located elsewhere in the computer system 400, and may comprise part or all of an integrated circuit. For instance, system 100 may comprise part of a communication interface 460 and may improve high-speed serial links performance for communication channels via communication interface 460, e.g., in an architecture of T-carrier, E-carrier and variants.

The various elements of FIG. 4 may be coupled to each other via a system bus 470, which represents one or more buses. In the case of multiple buses, they may be bridged by one or more bus bridges (not shown). Data may pass through the system bus 470 through the I/O Interface 450, for example, between an I/O device and the processors 410. The I/O signal may also be sent between discrete chips on a Multi-Chip Package (MCP). In one embodiment, such MCP could represent one or more processors 410 or any other component of system 400. In one embodiment a portion or all of the memory 430 could be integrated on an MCP with one or more processors 410. In one embodiment, one or more chips in system 400 may include system 100 or 200.

The system memory 430 and the NVM/Storage 440 may be employed to store a working copy and a permanent copy of the programming instructions implementing one or more operating systems, firmware modules or drivers, applications, and so forth, herein collectively denoted as 480. The permanent copy of the programming instructions may be placed into permanent storage in the factory, or in the field, through, for example, a distribution medium (not shown), such as a compact disc (CD), or through the communication interface 460 (from a distribution server (not shown)).

According to various embodiments, one or more of the depicted components of the system 400 and/or other element(s) may include a keyboard, LCD screen, non-volatile memory port, multiple antennas, graphics processor, application processor, speakers, or other associated mobile device elements, including a camera. The remaining constitution of the various elements of the computer system 400 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, specific types of logic switches and/or logic configurations, and so forth. In other embodiments, different configurations can be provided in view of whether or not certain signals are inverted, whether certain changes in state are triggered in response to falling edges instead of rising edges or vice versa, different logic switch configurations, and so forth.

These and other modifications can be made in light of the above detailed description. The terms used in the following claims should not be construed to be limited to the specific embodiments disclosed in the specification.

The following paragraphs describe examples of various embodiments.

Example 1 is an apparatus, which may include a switch coupled to a supply current source, the switch having first and second states; a pad coupled to the switch and having a pad capacitance that charges and discharges based on changes between the first and second states; and a resistor coupled to the switch and the pad, the resistor configured to be modulated to reduce a charging or discharging time of the pad capacitance.

Example 2 may include the subject matter of Example 1, and may further include a pulse generator, coupled with the resistor, configured to modulate a timing and a duration of the termination resistance.

Example 3 may include the subject matter of Examples 1 or 2, and may further specify that the first state is an on state and the second state is an off state, and the termination resistance is configured to increase when the switch is turned to the on state and decrease when the switch is turned to the off state.

Example 4 may include the subject matter of any one of Examples 1-3, and may further specify that the switch is a PMOS switch, and the PMOS switch is coupled to and driven by a buffer.

Example 5 may include the subject matter of any one of Examples 1-4, and may further specify that the switch is a first switch, the pad is first pad, the resistor is a first resistor, the termination resistance is a first termination resistance, the pad capacitance is a first pad capacitance, and the apparatus further comprises a second switch coupled to the supply current source, the second switch having third and fourth states; a second pad coupled to the second switch; and a second resistor coupled to the second switch and the second pad, the second resistor configured to modulate a second termination resistance of the serial link of the current mode driver to reduce a charging or discharging time of the second pad capacitance.

Example 6 may include the subject matter of Example 5, and may further specify that the pulse generator is a first pulse generator, and the apparatus further comprises a second pulse generator, coupled with the second resistor, configured to modulate a timing and a duration of the second termination resistance.

Example 7 may include the subject matter of Example 5 or 6, and may further specify that the third state is an on state and the fourth state is an off state and the termination resistance is configured to increase when the switch is turned to the third state and decrease when the switch is turned to the fourth state.

Example 8 may include the subject matter of any one of Examples 5-7, and may further specify that the buffer is a first buffer, the second switch is a PMOS switch, and the second switch is coupled to and driven by a buffer.

Example 9 may include the subject matter of Example 8, and may further specify that the first and second buffers are to receive a differential input control.

Example 10 may include the subject matter of Example 5, and may further specify the first pad is coupled to a first output, the second pad is coupled to a second output, and the first output and the second output are differential.

Example 11 may include the subject matter of any one of Examples 1 or 2, and may further specify that the resistor and the switch are in parallel connection.

Example 12 may include the subject matter of any one of Examples 1-11, and may further specify that the apparatus is a differential current-mode driver.

Example 13 is a method, which may include receiving, by a driver, an input control signal; operating, by the driver, a switch in response to the input control signal; and modulating, by the driver, a termination resistance of a serial link to reduce a charging or discharging time of a pad capacitance coupled to the switch.

Example 14 may include the subject matter of Example 13, and may further include increasing, by the driver, the termination resistance when the switch is turned to an on state; and decreasing, by the driver, the termination resistance when the switch is turned to an off state.

Example 15 may include the subject matter of Example 13, and may further include increasing, by the driver, the termination resistance when the switch is turned to an off state; and decreasing, by the driver, the termination resistance when the switch is turned to an on state, wherein the termination resistance and the switch are connected in parallel.

Example 16 may include the subject matter of Examples 13-15, and may further include operating, by the driver, a plurality of switches respectively connected to a plurality of resistors in causing the termination resistance to increase or decrease.

Example 17 may include the subject matter of any one of Examples 13-16, and may further include setting, by the driver, a delay of starting modulating the termination resistance after the switch is turned to an on or off state.

Example 18 may include the subject matter of any one of Examples 13-17, and may further include setting, by the driver, a duration of modulating the termination resistance.

Example 19 may include the subject matter of any one of Examples 13-18, and further specify that modulating may be during a transition edge of charging or discharging the capacitor.

Example 20 is a system, which may include a communication channel; a transmitter, coupled with the communication channel, configured to convert data into a signal stream to propagate on the communication channel; wherein the transmitter is configured to modulate a resistance of a resistor to reduce a charging or discharging time of a pad capacitance of a pad coupled with the resistor.

Example 21 may include the subject matter of Example 20, and further specifies that the transmitter may include a pulse generator, coupled with the resistor, configured to module a timing and duration of the modulation of the resistance.

Example 22 may include the subject matter of Example 21, and further specifies that the pulse generator sets the duration of the modulation of the resistance to be substantially equal to a unit interval of the data.

Example 23 may include the subject matter of any one of Examples 20-22, further specifies that the transmitter may include a PMOS switch, coupled with the resistor, in response to an input control signal to the transmitter, operable to control whether to increase or decrease the resistance.

Example 24 may include the subject matter of Example 23, further specifies that the transmitter may be configured to increase the resistance when the switch is turned to an on state, and decrease the resistance when the switch is turned to an off state.

Example 25 may include the subject matter of any one of Examples 20-24, further specifies that the transmitter may be configured to modulate the resistance during a transition edge of charging or discharging the pad capacitance.

Example 26 is an apparatus, which may include a voltage mode driver having first and second states; a pad coupled to the voltage mode driver and having a pad capacitance that charges or discharges when the voltage mode driver switches states; and a kicker circuit, coupled to the pad and the voltage mode driver, configured to reduce a charging or discharging time of the pad capacitance by modulating a current to the pad.

Example 27 may include the subject matter of Example 26, and further specifies that the kicker circuit may include a pulse generator configured to control a timing and a duration of the modulation.

Example 28 may include the subject matter of Example 26 or 27, and further specifies that the first state may be a charging state to enable the pad to make a rising transition, and the second state may be a discharging state to enable the pad to make a falling transition.

What is claimed is:

1. An apparatus, comprising:
    a switch coupled to a current source, the switch having first and second states;
    a pad coupled to the switch and having a pad capacitance that charges or discharges when the switch switches state;
    a resistor coupled to the switch and the pad, the resistor configured to be modulated to reduce a charging or discharging time of the pad capacitance; and
    a pulse generator, coupled with the resistor, configured to control a timing and a duration of the modulation.

2. The apparatus of claim 1, wherein the resistor and the switch are in series connection.

3. The apparatus of claim 1, wherein the first state is an on state and the second state is an off state, and the resistor is configured to increase resistance when the switch is turned to the on state and decrease resistance when the switch is turned to the off state.

4. The apparatus of claim 1, wherein the resistor and the switch are in parallel connection.

5. An apparatus comprising:
    a first switch coupled to a current source, the first switch having first and second states, wherein the first switch is coupled to and driven by a buffer;
    a first pad coupled to the first switch and having a first pad capacitance that charges or discharges when the first switch switches state; and
    a first resistor coupled to the first switch and the first pad, the first resistor configured to be modulated to reduce a charging or discharging time of the first pad capacitance;
    a second switch coupled to the current source, the second switch having third and fourth states;
    a second pad coupled to the second switch; and
    a second resistor coupled to the second switch and the second pad, the second resistor configured to be modulated to reduce a charging or discharging time of the second pad capacitance.

6. The apparatus of claim 5, further comprising:
    a first pulse generator, coupled with the first resistor, configured to control a timing and a duration of the modulation of the first resistor; and
    a second pulse generator, coupled with the second resistor, configured to control a timing and a duration of the modulation of the second resistor.

7. The apparatus of claim 5, wherein the third state is an on state and the fourth state is an off state and the resistor is configured to increase resistance when the switch is turned to the third state and decrease resistance when the switch is turned to the fourth state.

8. The apparatus of claim 5, wherein the buffer is a first buffer, the second switch is a p-channel metal oxide semiconductor switch, and the second switch is coupled to and driven by a second buffer.

9. The apparatus of claim 8, wherein the first and second buffers are to receive differential input control signals.

10. An apparatus comprising:
    a switch coupled to a current source, the switch having first and second states;
    a pad coupled to the switch and having a pad capacitance that charges or discharges when the switch switches state; and
    a resistor coupled to the switch and the pad, the resistor configured to be modulated to reduce a charging or discharging time of the pad capacitance;
    wherein the apparatus is a differential current-mode driver.

11. A system, comprising:
    a communication channel; and
    a transmitter, coupled with the communication channel, configured to convert data into a signal stream to propagate on the communication channel;
    wherein the transmitter is configured to modulate a resistance of a resistor in the transmitter to reduce a charging or discharging time of a pad capacitance of a pad coupled with the resistor; and
    wherein the transmitter includes a pulse generator, coupled with the resistor, to modulate a timing and duration of the resistance modulation.

12. The system of claim 11, wherein the pulse generator sets the duration of the modulation to be substantially equal to a unit interval of the data.

13. The system of claim 11, wherein the transmitter comprises a p-channel metal oxide semiconductor switch, coupled with the resistor, in response to an input control signal to the transmitter, operable to control whether to increase or decrease the resistance of the resistor.

14. The system of claim 13, wherein the transmitter is configured to increase the resistance of the resistor when the switch is turned to an on state, and decrease the resistance of the resistor when the switch is turned to an off state.

15. The system of claim 11, wherein the transmitter is configured to modulate the resistance of the resistor during a transition edge of the pad.

16. An apparatus, comprising:
    a voltage mode driver having first and second states;
    a pad coupled to the voltage mode driver and having a pad capacitance that charges or discharges when the voltage mode driver switches states;
    a kicker circuit, coupled to the pad and the voltage mode driver, configured to reduce a charging or discharging time of the pad capacitance by modulating a current to the pad, wherein the kicker circuit includes a pulse generator to control a timing and a duration of the modulation.

17. The apparatus of claim 16, wherein the first state is a charging state to enable the pad to make a rising transition, and the second state is a discharging state to enable the pad to make a falling transition.

* * * * *